United States Patent
Rolandi et al.

(10) Patent No.: US 6,195,283 B1
(45) Date of Patent: Feb. 27, 2001

(54) METHOD AND DEVICE FOR ANALOG PROGRAMMING OF NON-VOLATILE MEMORY CELLS

(75) Inventors: Pier Luigi Rolandi, Monleale; Roberto Canegallo, Tortona; Ernestina Chioffi, Pavia; Danilo Gerna, Montagna in Valtellina; Marco Pasotti, S. Martino Siccomario, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/076,013

(22) Filed: May 11, 1998

(30) Foreign Application Priority Data

May 9, 1997 (EP) .................................................. 97830216

(51) Int. Cl.$^7$ ...................................................... G11C 7/00
(52) U.S. Cl. .............................. 365/185.03; 365/185.19; 365/185.2
(58) Field of Search ................................ 365/185.03, 45, 365/220, 185.2, 210, 185.19, 189.07, 185.21, 185.24

(56) References Cited

U.S. PATENT DOCUMENTS

| | | | |
|---|---|---|---|
| 5,629,890 | * 5/1997 | Engh ................................. | 365/45 X |
| 5,675,537 | * 10/1997 | Bill et al. ........................ | 365/185.03 X |
| 5,712,815 | * 1/1998 | Bill et al. ........................ | 365/185.03 |
| 5,768,184 | * 6/1998 | Hayashi et al. ................. | 365/185.03 |
| 5,801,991 | * 9/1998 | Keeney ........................... | 365/185.23 |
| 5,903,487 | * 5/1999 | Wu et al. ........................ | 365/185.03 X |

FOREIGN PATENT DOCUMENTS

| | | |
|---|---|---|
| WO 90/00801 | 1/1990 | (WO) . |
| WO 92/13350 | 8/1992 | (WO) . |
| WO 96/08823 | 3/1996 | (WO) . |

OTHER PUBLICATIONS

Gastaldi et al., "A 1–Mbit CMOS EPROM with Enhanced Verification," *I.E.E.E. Journal of Solid–State Circuits*, Oct. 1988, No. 5, New York, USA, pp. 1150–1156.

Blyth et al., "A Non–Volatile Analog Storage Device Using EEPROM Technology," I.E.E.E. International Solid–State Circuits Conference, Feb. 1991, New York, USA, 3 pages.

* cited by examiner

*Primary Examiner*—A Zarabian
(74) *Attorney, Agent, or Firm*—Theodore E. Galanthay; Robert Iannucci; Seed IP Law Group PLLC

(57) ABSTRACT

For each memory cell to be programmed, the present threshold value of the cell is determined; the desired threshold value is acquired; the analog distance between the present threshold value and the desired threshold value is calculated; and a programming pulse is then generated, the duration of which is proportional to the analog distance calculated. The programming and reading cycle is repeated until the desired threshold is reached. By this means a time saving is obtained, owing to the reduction of the number of intermediate reading steps. The method permits programming in parallel and simultaneously of a plurality of cells of a memory array which is connected to a single word line and to different bit lines, each with a programming pulse the duration of which is proportional to the analog distance calculated for the same cell. The programming process is thus very fast, owing to parallel application of the programming and the saving in the intermediate reading cycles.

21 Claims, 3 Drawing Sheets

METHOD AND DEVICE FOR ANALOG PROGRAMMING OF NON-VOLATILE MEMORY CELLS

TECHNICAL FIELD

The present invention relates to a method and a device for analog programming of non-volatile memory cells, in particular flash memory cells.

BACKGROUND OF THE INVENTION

As is known, analog programming of a memory cell consists of modifying to a desired analog value the threshold voltage value of the cell (i.e., the minimum voltage to be applied between the gate terminals and the source of the cell itself, in order for the cell to begin to conduct current). Programming is currently carried out in a memory array by connecting the gate terminal of the cell to be programmed to a reference voltage, the drain terminal to a high programming voltage, and the source terminal to ground. Since the programming is a non-reproducible process, it is carried out in multi-level memories by providing a plurality of programming pulses of short duration, and by reading the threshold voltage value reached by the cell at the end of each programming pulse (verify step). In general during each programming pulse, the gate terminal of the cell to be programmed is supplied with a high programming voltage. In general the programming process is preceded by a cell erasing step, such that the cells have a low initial threshold voltage (lower than the minimum analog value to be stored) and each programming pulse gives rise to an increase of the threshold voltage of the cell; when the desired threshold voltage is reached, the programming process is interrupted. Generally speaking therefore, programming is carried out at present by gradually modifying the initial threshold voltage value through short programming pulses, followed by reading the reached level, until the desired level is obtained.

In order to avoid programming the cell excessively, the programming pulses are short, as indicated above, such that when a cell must sustain a large threshold jump, the described process requires a large number of programming/reading cycles, and thus involves a considerable programming time.

SUMMARY OF THE INVENTION

The invention is directed to a method and a programming device which permit reduction of the programming time of memory cells.

According to one embodiment of the present invention, a method for analog programming of non-volatile memory cells, for example flash memory cells, is provided. The method includes acquiring a desired programming value, detecting a value stored in the memory cell, detecting a difference value which is equal to the difference between the desired programming value and the stored value, and generating for the memory cell a programming pulse having a duration which is correlated to the difference value.

Furthermore, according to another embodiment of the invention, a device for analog programming of non-volatile memory cells, for example flash memory cells, is provided. The device includes input means for acquiring a desired programming value, reading means for determining a value stored in the memory cell, pulse modulation means determining a difference value equal to the difference between the desired programming value and the stored value, and generating a programming pulse for the memory cell, with a duration correlated to the difference value.

BRIEF DESCRIPTION OF THE DRAWINGS

In order to allow the present invention to be understood, a preferred embodiment is now described, purely by way of non-limiting example, with reference to the attached drawings.

DETAILED DESCRIPTION OF THE INVENTION

According to the present method, the present threshold value is determined directly or indirectly for each cell to be programmed; the desired threshold value is acquired; the analog distance between the present threshold value and the desired threshold value is calculated; and a programming pulse is then generated, the duration of which is proportional to the analog distance calculated. Subsequently, the threshold level reached is read and compared once more with the desired threshold value, and further programming pulses can be supplied, the duration of which can be determined on the basis of the distance between the desired threshold value and the threshold value reached, or the pulses can be fixed and short, similarly to known solutions.

Therefore, when a cell is to be programmed with a desired threshold voltage, the value of which is remote from the present value, at least the first programming pulse is much longer than the standard pulse, reducing substantially the total programming time by reducing the number of reading operations and saving the corresponding intermediate times necessary in order to transfer the circuit from the reading condition to the programming condition and vice versa in the various programming/reading cycles.

This process also permits programming in parallel of a plurality of cells which belong to the same line and different columns, each with a programming pulse, the duration of which is proportional to the analog distance between the present threshold value of each cell and the desired threshold value for the same cell. This process requires suitable pulse control circuitry for each column, and involves a programming time for each cycle which is related to the duration of the longest programming pulse from among those planned for the various columns programmed in parallel. In this case therefore, with increased complexity of the control circuitry, a considerable saving of time is obtained altogether by means of parallel application of the programming, and the saving in the reading cycles.

Figure 1:
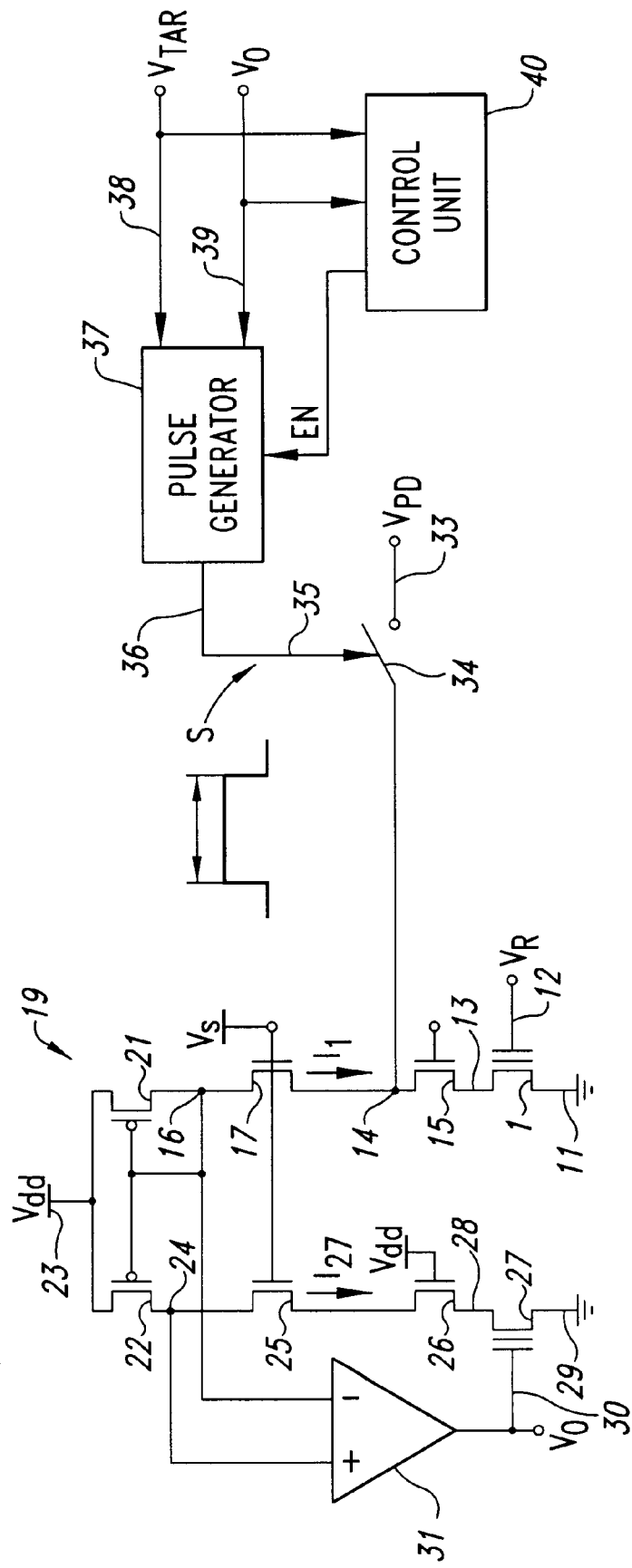
FIG. 1 is a circuit diagram of a device for programming a memory cell.

An example of a programming device for a cell which uses a specific circuit for reading the threshold voltage is shown in FIG. 1, and is described hereinafter. In particular, the reading circuit in FIG. 1 provides an indirect value of the present threshold voltage of the cell to be programmed, and is described in detail in European patent application 97830172.9 dated Apr. 15, 1997 with the title "High-precision analogue reading circuit for memory matrices, in particular flash analog memory matrices", incorporated herein for reference. However the present invention is not limited to this type of reading circuit, although it is advantageously applicable to the latter, and can also be implemented with other reading circuits which directly or indirectly can supply the present threshold voltage value of the cell.

In FIG. 1, the cell 1 to be programmed has a source terminal 11 which is connected to ground, a gate terminal 12 which is biased to a reading voltage $V_R$, and a drain terminal 13 which is connected to a first node 14 through an NMOS-type selector switch 15. The first node 14 is connected to a second node 16 through a first biasing transistor 17; the second node 16 is in turn connected to a current mirror circuit 19 formed by two PMOS transistors 21, 22. In detail, the PMOS transistor 21 is diode-connected (i.e, it has short-circuited drain and gate terminals) and has a drain terminal connected to the node 16 is, a source terminal connected to the supply line 23 which is set to $V_{dd}$, and a gate terminal connected to the gate terminal of the PMOS transistor 22. The PMOS transistor 22 has a source terminal connected to the supply line 23 and a drain terminal connected to a node 24.

The node 24 is connected through a second biasing transistor 25 also of the NMOS type and a dummy switch 26 which is always maintained closed, to the drain terminal 28 of a reference cell 27. The reference cell 27 is, for example, a virgin cell, which has its source terminal 29 connected to ground and its gate terminal 30 connected to the output of an operational amplifier 31. The operational amplifier 31 has an inverting input which is connected to the node 16, and a non-inverting input which is connected to the node 24.

The node 14 is connected to a programming voltage line 33, which is set to the programming voltage $V_{PD}$, through a controlled switch 34 which has a control terminal 35 connected to an output 36 of a pulse generator 37. The pulse generator 37 has a first and a second input 38, 39 which respectively receive a target threshold voltage $V_{TAR}$ (which is proportional to the desired threshold voltage) and the output voltage $V_o$ of the operational amplifier 31 (which, as explained hereinafter, is proportional to the present threshold voltage of the cell 1 to be programmed). The pulse generator 37 generates a control pulse S which is supplied to the controlled switch 34, and has a duration proportional to the difference between the target threshold voltage $V_{TAR}$ and the output voltage $V_o$, and thus between the desired threshold voltage and the present threshold voltage.

A control unit 40 provides the pulse generator 37 with a signal EN which enables and de-enables the pulse generator 37 when the cell 1 is to be programmed and when the programming is completed.

The circuit in FIG. 1 operates as follows. Initially, the initial value of the output voltage $V_o$ of the operational amplifier 31 is determined, and the target voltage $V_{TAR}$ is acquired. The pulse generator 37 then generates the control pulse S, which causes controlled switch 34 to close and node 14 to be connected to the programming voltage $V_{PD}$ for a time which is proportional to the difference between the desired threshold voltage and the present threshold voltage of the cell 1. At the end of the pulse S, the new value of the output voltage $V_o$. is determined, and on the basis of the latter a further programming and reading cycle is optionally initiated; the programming and reading cycles are then repeated until the desired threshold value is reached.

Reading of the present threshold voltage of the cell 1 through output voltage $V_o$ is carried out as follows. As described in detail in the aforementioned European patent application 97830172.9, the current mirror circuit 19 forces the same currents $I_1=I_{27}$ into the cell 1 to be programmed and into the reference cell 27. The biasing transistors 17 and 25 maintain the cells 1 and 27 in the linear region, keeping the voltage drop between their drain and source terminals constant. In addition, in a condition of equilibrium, the voltages at the inputs of the operational amplifier 31 (voltages at the nodes 16 and 24) are the same, and, since the biasing transistors 17, 25 receive the same biasing voltage $V_S$ (for example 1.5 V) at the gate terminal, they have the same gate-source drop. Consequently, leaving out of consideration the voltage drop across the selector switch 15 and the dummy switch 26, the following is obtained:

$$V_{DS,1}=V_{DS,27}$$

i.e., the drain-source voltage is the same in the cell 1 to be programmed and in the reference cell 27.

Furthermore, provided that the cell 1 to be read and the reference cell 27 are equal and manufactured using the same technology, the current $I_1$ which flows through the cell 1 to be programmed and the current $I_{27}$ which flows through the reference cell 27 are provided by the following, in the first approximation:

$$I_1=K*(W/L)*[(V_R-V_{th,1})]*V_{DS,1} \quad (1)$$

$$I_{27}=K*(W/L)*[(V_o-V_{th,27})]*V_{DS,27} \quad (2)$$

where $V_{th,1}$ and $V_{th,27}$ are respectively the threshold voltages of the cell 1 to be programmed and the reference cell 27, K is a constant which is associated with the production process, and W/L is the dimensional ratio (width to length) of the cells.

Since $I_1=I_{27}$, by equalising (1) and (2), the following is obtained by means of simple calculations:

$$V_o=V_R-(V_{th,1}-V_{th,27}) \quad (3)$$

i.e., the output voltage $V_o$ is linearly dependent on the threshold voltage $V_{th,1}$ of the cell 1 to be read, via the gate biasing voltage $V_R$ and the threshold voltage $V_{th,27}$ of the reference cell 27.

The presence of the values $V_R$ and $V_{th,27}$ in (3) does not create problems, since the target voltage $V_{TAR}$ can be calculated by summing the desired threshold value for the cell 1 and values $V_R$ and $V_{th,27}$. However, this would require accurate knowledge of the threshold voltage $V_{th,27}$ of the reference cell 27, which is not always present. In effect, this knowledge is not necessary. In fact for programming and subsequent reading of the threshold voltage of the cell 1, it is possible to use solely the relative value of the threshold voltage of the cell 1 with respect to the threshold voltage of the reference cell 27, i.e., the difference between them which thus becomes the value to be stored. In this case, programming of the cell 1 consists of modifying the threshold of the cell itself such that the output voltage $V_o$ becomes equal to the sum of the value to be stored (desired difference between the thresholds of cells 1 and 27) and the gate biasing voltage $V_R$. In this case, the target voltage $V_{TAR}$ is equal to this sum, and the pulse generator supplies a pulse, the duration of which is proportional to the distance between the desired difference between the thresholds of the cells 1 and 27 (value to be stored) and the present difference, since the term $V_R$ is cancelled out.

Figure 2:
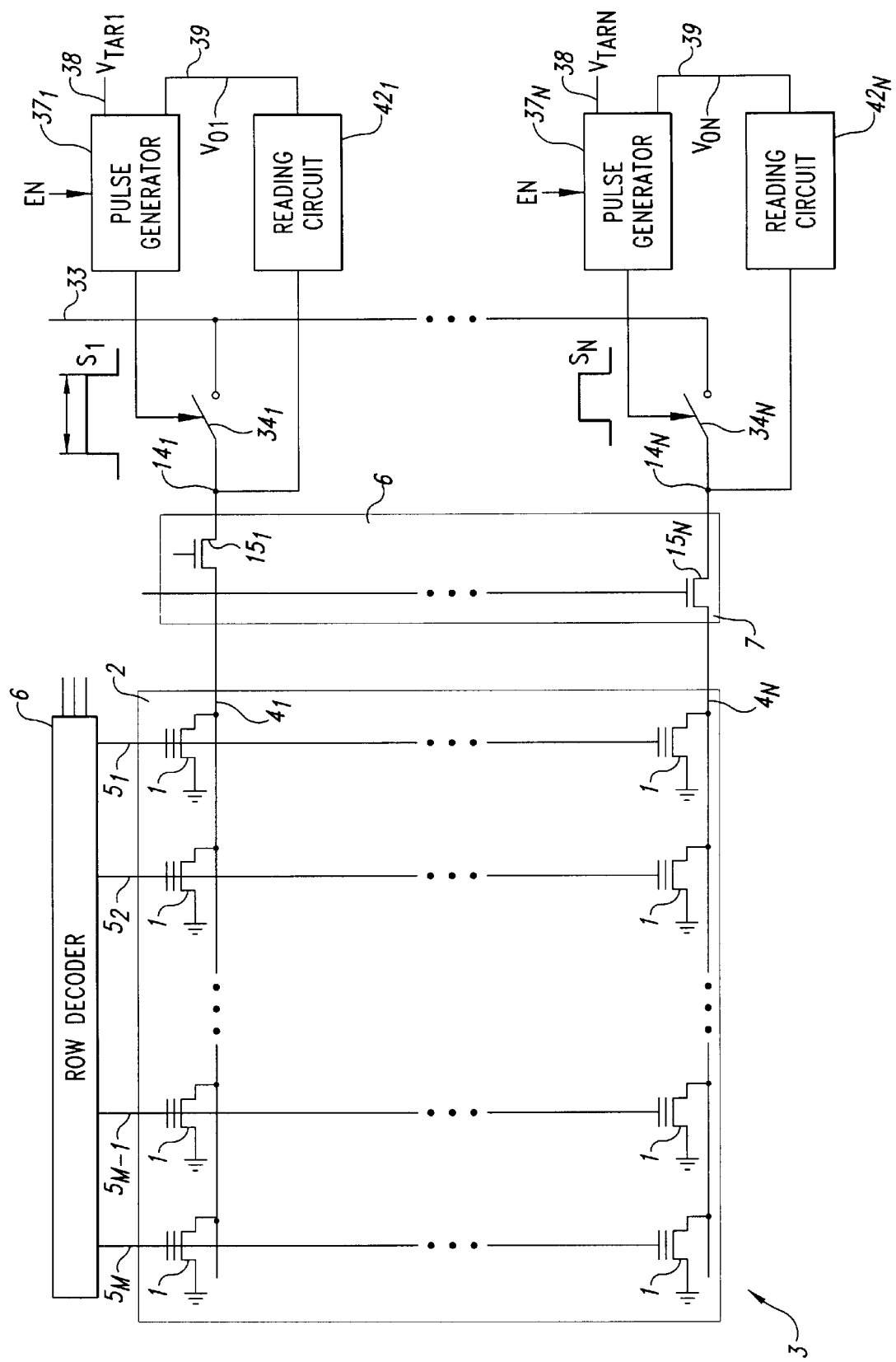
FIG. 2 is a schematic circuit diagram of the device for programming a memory array.

FIG. 2 shows an embodiment which permits programming in parallel of a plurality of cells which belong to different columns. The cells 1 are disposed on lines and in columns in order to form a portion (for example a sector or part of the latter) of a memory array 2 which belongs to a memory 3, of which components not essential for understanding of the invention are not shown.

In detail, the cells 1 are connected to a plurality of bit lines $4_1-4_N$ and a plurality of word lines $5_1-5_M$. The word lines $5_1-5_M$ are connected to a row decoder 6; the bit lines $4_1-4_n$.

are connected to the programming voltage line 33 via a selection transistor 15$_1$14 15$_N$ which belongs to a column decoder 7. In addition, a controlled switch 34$_1$–34$_N$ is disposed between each selection transistor 15$_1$–15$_N$ and the programming voltage line 33.

Each controlled switch 34$_1$–34$_N$ receives a control signal S$_1$–S$_N$ from a pulse generator 37$_1$–37$_N$ which in turn receives at its input a target threshold voltage value V$_{TAR1}$–V$_{TARN}$ and a threshold voltage value read V$_{O1}$–V$_{ON}$ supplied by a reading circuit 42$_1$–42$_N$. Each reading circuit 42$_1$–42$_N$ has an input which is connected to the node 14$_1$–14$_N$ present between each selection transistor 15$_1$–15$_N$ and the controlled switch 34$_1$–34$_N$ The reading circuits are the same as one another; they are preferably produced as shown in FIG. 1, and each comprise the biasing transistors 17, 25; the current mirror circuit 19; the dummy transistor 26, the reference cell 27 and the operational amplifier 31.

In the diagram in FIG. 2, it is possible to carry out programming in parallel of all the cells connected to the bit lines 4$_1$–4$_N$ and to a specific word line, for example the word line 5$_1$. In this case, the row decoder 6, which is controlled in a known manner by a logic unit not shown, polarizes the word line 5$_1$ to the reference voltage V$_R$ and maintains the other word lines 5$_2$–5$_M$ grounded, such that the cells connected to these word lines 5$_2$–5$_M$ continue to be switched off. Each reading circuit 42$_1$–42$_N$ reads the present value of the threshold voltage of the cell 1, and supplies it to the pulse generator 37$_1$–37$_N$ which also receives the value of the target threshold voltage V$_{TAR1}$–V$_{TARN}$. When the enabling signal EN is received, the pulse generators 37$_1$–37$_N$ then each supply their own pulse S$_1$–S$_N$ of different duration. Repetition of the reading/programming cycles then makes it possible to reach the desired threshold value for all the N cells connected to the word line 5$_1$, thus permitting simultaneous programming of a plurality of cells.

Figure 3:
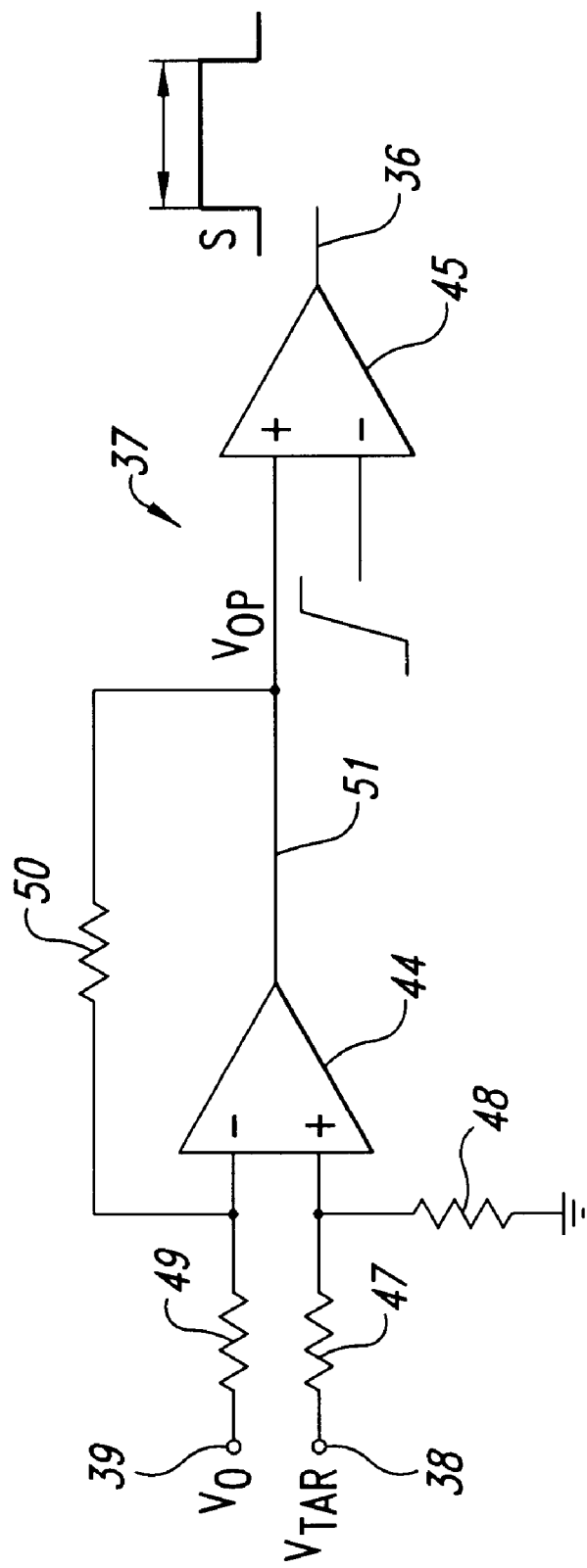
FIG. 3 is a circuit diagram of a pulse generator of the programming circuit shown in FIGS. 1 and 2.

FIG. 3 shows one implementation of the pulse generator 37 by means of an operational amplifier 44 in a differential amplifier configuration, and a comparator 45. This figure does not show the enabling input for the signal EN. In detail, the operational amplifier 44 has a non-inverting input connected to the input 38 through a first resistor 47, and to ground through a second resistor 48, and has an inverting input connected to the input 39 through a third resistor 49, and to the output 51 through a fourth resistor 50. The comparator 45 has a positive input connected to the output 51 of the operational amplifier 44, a negative input receives a ramp signal, and an output that forms the output 36 of the pulse generator 37.

The resistors 47–50 all have the same resistance R; consequently at the output 51 of the operational amplifier 44, there is a voltage signal V$_{OP}$=V$_{TAR}$–V$_o$ which is compared with the ramp signal supplied to the negative input of the comparator 45. The signal S at the output of the comparator 45 thus has a high value until the amplitude of the ramp signal is lower than the signal V$_{OP}$, and switches to the low state as soon as the ramp signal exceeds the signal V$_{OP}$, By this means, the duration of the signal S is proportional to the difference between the threshold voltages V$_{TAR}$–V$_o$.

Some advantages which can be obtained by means of the method and the device described are as follows. Firstly, as described above, they permit considerable reduction of the programming times of each memory cell. Additionally, compared with memories which permit programming of a single cell at a time, a considerable saving of time is obtained by means of programming in parallel of a plurality of cells. The device is inherently simple and reliable, and can be used without problems in present flash memories.

Finally, it will be appreciated that numerous modifications and variants, all of which come within the scope of the inventive concept, can be made to the method and the device described and illustrated here.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for analog programming of a non-volatile memory cell which can store an analog value, comprising the steps of:
    acquiring a desired programming value;
    detecting a value stored in the memory cell;
    determining a difference value which is equal to the difference between said desired programming value and said stored value; and
    generating a programming pulse for said memory cell using said difference value to control a duration of the programming pulse.

2. The method according to claim 1, wherein for a plurality of memory cells connected to a single selection line and to a plurality of biasing lines, the method comprises the steps of:
    acquiring a desired programming value for each memory cell;
    detecting a value stored in each memory cell;
    calculating a difference value associated with each memory cell, each difference value being equal to the difference between said desired programming value and said stored value for the respective memory cell; and
    generating in parallel a plurality of programming pulses, one for each memory cell, each programming pulse having a duration which is correlated to said difference value associated with said respective cell.

3. The method according to claim 1 wherein after said generating step, the stored value of each memory cell is determined once more, and if the newly determined stored value differs from said desired programming value, a new programming pulse is generated.

4. The method according to claim 1 wherein the step of detecting a value stored in the memory cell includes detecting a difference between the value stored in the memory cell and a value stored in a reference cell connected in parallel with the memory cell.

5. The method according to claim 4 wherein the step of detecting a value stored in the memory cell includes ensuring that the memory cell and the reference cell each operate in a linear region and driving the memory cell and the reference cell with substantially identical currents.

6. An analog programming device for a non-volatile memory cell which can store an analog value, comprising:
    input means for acquiring a desired programming value;
    reading means for determining a value stored in said memory cell; and
    pulse modulation means for determining a difference value equal to the difference between said desired programming value and said stored value, and for generating for said memory cell a programming pulse using the difference value to control a duration of the programming pulse.

7. The device according to claim 6 for a memory array that includes a plurality of memory cells connected to a single selection line and to a plurality of biasing lines, wherein the device comprises:

a plurality of input means each acquiring a desired programming value for a respective memory cell;

a plurality of reading means each determining the value stored in a respective memory cell; and a plurality of pulse modulation means for determining a difference value associated with each memory cell and equal to the difference between said desired programming value and said value stored by the respective memory cell, and for generating in parallel a plurality of programming pulses each for a respective memory cell, each programming pulse having a duration correlated to said difference value associated with said respective memory cell.

8. The device according to claim 6, wherein said pulse modulation means comprises an operational amplifier in a differential configuration, and a comparator which has a first input which is connected to an output of said operational amplifier and a second input which receives a comparative ramp signal.

9. The device according to claim 6, further comprising a programming voltage line which is connected to a drain terminal of said memory cell via a controlled switch which has a control terminal connected to said pulse modulation means.

10. The device according to claim 6, wherein said reading means comprise a current mirror circuit having a first and a second node which supply equal first and second currents to a first terminal of said memory cell and, respectively, to a first terminal of a reference cell; and an operational amplifier which has a first input connected to said first node, a second input connected to said second node and an output connected to a control terminal of said reference cell and to an input of said pulse modulation means, said first terminal of the memory cell receiving said programming pulse.

11. The device according to claim 10 wherein the current mirror circuit:

a first biasing transistor having a first terminal connected to the first node, a second terminal connected to the memory cell, and a control terminal connected to a biasing voltage that maintains the memory cell operating in a linear region; and a second biasing transistor having a first terminal connected to the second node, a second terminal connected to the reference cell, and a control terminal connected to the biasing voltage which maintains the reference cell operating in a linear region.

12. The device according to claim 10 wherein the reference cell is substantially identical to the memory cell.

13. An analog programming device for a memory cell that can store an analog value, comprising:

a reading circuit structured to determine a present threshold voltage of the memory cell and generate an output voltage indicative of the present threshold voltage; and a pulse generator having a first input coupled to receive the output voltage from the reading circuit and a second input coupled to receive a desired threshold voltage, the pulse generator being structured to determine a difference between the present threshold voltage and the desired threshold voltage and provide to the memory cell a programming pulse with a duration proportional to the difference between the desired threshold voltage and the present threshold voltage.

14. The device according to claim 13 wherein the memory cell is one of a plurality of memory cells connected to a single selection line, the reading circuit is one of a plurality of reading circuit each connected respectively to one of the plurality of memory cells, and the pulse generator is one of a plurality of pulse generators each connected respectively to one of the plurality of memory cells, each reading circuit being structured to determine a present threshold voltage of its respective memory cell and generate an output voltage indicative thereof, each pulse generator being structured to provide to its respective memory cell a programming pulse with a duration proportional to a difference between a desired threshold voltage for the memory cell and the present threshold voltage of the memory cell.

15. The device according to claim 13 wherein the pulse generator includes:

a differential amplifier with a first input coupled to first input of the pulse generator, a second input coupled to the second input of the pulse generator, and an output; and a comparator with a first input coupled to the output of the differential amplifier, a second input coupled to receive a ramp signal, and an output that generates an output signal with a duration proportional to the difference between the desired threshold voltage and the present threshold voltage.

16. The device according to claim 15, further comprising a control switch having an input terminal coupled to a programming voltage, an output terminal coupled to the memory cell, and a control terminal coupled to the output of the comparator, the control switch outputting to the memory cell the programming pulse according to the output signal generated by the comparator.

17. The device according to claim 13 wherein the reading circuit includes:

an operational amplifier having a first input connected to the memory cell, a second input connected to a reference cell, and an output connected to a control terminal of the reference cell and to the first input of the pulse generator.

18. The device according to claim 17 wherein the reading circuit includes:

a current mirror circuit having first and second nodes which supply substantially equal first and second currents to a first terminal of the memory cell and, respectively, to a first terminal of the reference cell.

19. The device according to claim 18, wherein the current mirror circuit further includes:

a first biasing transistor having a first terminal connected to the first node, a second terminal connected to the memory cell, and a control terminal connected to a biasing voltage that maintains the memory cell operating in a linear region; and a second biasing transistor having a first terminal connected to the second node, a second terminal connected to the reference cell, and a control terminal connected to the biasing voltage which maintains the reference cell operating in a linear region.

20. The device according to claim 17 wherein the reference cell is substantially identical to the memory cell.

21. The method of claim 1 wherein the step of generating a programming pulse includes generating a programming pulse of substantially constant amplitude.

* * * * *